United States Patent
Knoll et al.

(10) Patent No.: US 12,426,343 B2
(45) Date of Patent: Sep. 23, 2025

(54) INSULATED GATE STRUCTURE, WIDE BANDGAP MATERIAL POWER DEVICE WITH THE SAME AND MANUFACTURING METHOD THEREOF

(71) Applicant: Hitachi Energy Ltd, Zürich (CH)

(72) Inventors: Lars Knoll, Hägglingen (CH); Stephan Wirths, Thalwil (CH); Andrei Mihaila, Rieden (CH)

(73) Assignee: Hitachi Energy Switzerland AG, Baden (CH)

( * ) Notice: Subject to any disclaimer, the term of this patent is extended or adjusted under 35 U.S.C. 154(b) by 517 days.

(21) Appl. No.: 17/912,221

(22) PCT Filed: Feb. 25, 2021

(86) PCT No.: PCT/EP2021/054741
§ 371 (c)(1),
(2) Date: Sep. 16, 2022

(87) PCT Pub. No.: WO2021/185554
PCT Pub. Date: Sep. 23, 2021

(65) Prior Publication Data
US 2023/0187525 A1    Jun. 15, 2023

(30) Foreign Application Priority Data
Mar. 17, 2020 (EP) .................................. 20163646

(51) Int. Cl.
*H10D 64/68* (2025.01)
*H10D 62/83* (2025.01)
(Continued)

(52) U.S. Cl.
CPC ....... *H10D 64/685* (2025.01); *H10D 62/8325* (2025.01); *H10D 64/01* (2025.01);
(Continued)

(58) Field of Classification Search
None
See application file for complete search history.

(56) References Cited

U.S. PATENT DOCUMENTS

| 6,246,076 | B1 | 6/2001 | Lipkin et al. |
| 7,507,629 | B2 | 3/2009 | Lucovsky et al. |

(Continued)

FOREIGN PATENT DOCUMENTS

| CN | 104137266 A | 11/2014 |
| CN | 106571300 A | 4/2017 |

(Continued)

OTHER PUBLICATIONS

Galuska, A., et al., "Detection Limit for Carbon in InSb During SIMS Depth Profiling", Surface and Interface Analysis, vol. 17, May 23, 1990, 7 pages.

(Continued)

*Primary Examiner* — Zandra V Smith
*Assistant Examiner* — Molly K Reida
(74) *Attorney, Agent, or Firm* — Slater Matsil, LLP

(57) ABSTRACT

An insulated gate structure includes a wide bandgap material layer having a channel region of a first conductivity type. A gate insulating layer is arranged directly on the channel region and has a first nitride layer that is arranged directly on the channel region. The gate insulating layer has a concentration of carbon atoms that is less than $10^{18}$ atoms/cm$^{-3}$ at a distance of 3 nm from an interface between the wide bandgap material layer and the first nitride layer. An electrically conductive gate electrode layer overlies the gate insulating layer so that the gate electrode layer is separated from the wide bandgap material layer by the gate insulating layer.

20 Claims, 9 Drawing Sheets

(51) Int. Cl.
  *H10D 62/832* (2025.01)
  *H10D 62/85* (2025.01)
  *H10D 64/01* (2025.01)
  *H10D 64/27* (2025.01)
  *H10D 62/80* (2025.01)

(52) U.S. Cl.
  CPC ......... *H10D 64/514* (2025.01); *H10D 64/693* (2025.01); *H10D 62/80* (2025.01); *H10D 62/8303* (2025.01); *H10D 62/8503* (2025.01)

(56) References Cited

U.S. PATENT DOCUMENTS

| | | |
|---|---|---|
| 7,727,904 B2 | 6/2010 | Das et al. |
| 9,984,894 B2 | 5/2018 | Dhar et al. |
| 2008/0135954 A1 | 6/2008 | Ohmi et al. |
| 2009/0090919 A1 | 4/2009 | Uchida |
| 2010/0012949 A1 | 1/2010 | Soukiassian |
| 2012/0241767 A1 | 9/2012 | Yano et al. |
| 2012/0315770 A1 | 12/2012 | Nakashima et al. |
| 2015/0187882 A1 | 7/2015 | Park et al. |
| 2015/0303271 A1 | 10/2015 | Tanaka et al. |
| 2017/0033185 A1 | 2/2017 | Shimizu et al. |
| 2019/0267451 A1 | 8/2019 | Araoka et al. |
| 2022/0157607 A1 | 5/2022 | Aichinger et al. |

FOREIGN PATENT DOCUMENTS

| | | |
|---|---|---|
| CN | 110349853 A | 10/2019 |
| EP | 2515336 B1 | 3/2016 |
| FR | 2888399 A1 | 1/2007 |
| JP | 2008147365 A | 6/2008 |
| JP | 2009088440 A | 4/2009 |
| JP | 2010067917 A | 3/2010 |
| JP | 5610492 B2 | 10/2014 |
| JP | 2016201500 A | 12/2016 |
| JP | 2017034003 A | 2/2017 |
| JP | 2017204644 A | 11/2017 |
| JP | 2019091941 A | 6/2019 |

OTHER PUBLICATIONS

Lipkin, L., et al., "Insulator Investigation on SiC for Improved Reliability", IEEE Transactions on Electron Devices, vol. 46, No. 3, Mar. 1999, 8 pages.

Noborio, M., et al., "4H—SiC MIS Capacitors and MISFETs With Deposited SINx/SiO2 Stack-Gate Structures", IEEE Transactions on Electron Devices, vol. 55, No. 8, Aug. 2008, 8 pages.

INSULATED GATE STRUCTURE, WIDE BANDGAP MATERIAL POWER DEVICE WITH THE SAME AND MANUFACTURING METHOD THEREOF

CROSS-REFERENCE TO RELATED APPLICATIONS

This application is a national stage application of International Application No. PCT/EP2021/054741, filed on Feb. 25, 2021, which claims priority to European Patent Application No. 20163646.1, filed on Mar. 17, 2020, which applications are hereby incorporated herein by reference.

TECHNICAL FIELD

The present invention relates to an insulated gate structure, to a wide bandgap power device with the insulated gate structure and to a manufacturing method thereof.

BACKGROUND

JP 2017 204644 A discloses a MOSFET with an insulated gate structure comprising a SiC layer, a 6 nm thick silicon oxynitride layer as a first gate insulating layer and a gate electrode, wherein a carbon concentration has a peak at 1 nm from the interface between the first gate insulating layer and the SiC layer and is below the SIMS detection limit at 3 nm from that interface. The first insulating layer may be formed by oxynitridation of a Si layer.

JP 2019 091941A discloses a method for manufacturing an insulated gate structure comprising the following steps: forming a silicon oxide film on a SiC layer by thermal oxidation, oxynitridation of the silicon oxide film such that a region, in which nitrogen is segregated, is formed between the SiC layer and the silicon oxide film, and nitrogen plasma treatment of the silicon oxide film to nitride the silicon oxide film surface.

JP 2010 067917 A discloses a method for manufacturing an insulated gate structure comprising the following steps: forming Si thin film on a SiC epitaxial layer, injecting nitrogen atoms into the Si thin film, deposition of a $SiO_2$ film on the Si thin film and annealing in nitrogen oxide gas at a temperature between 1000 and 1300 degree Celsius to oxynitride the SiC epitaxial layer.

US 2015/187882 A1 discloses a method of manufacturing an insulated gate structure comprising deposition of crystalline or amorphous silicon (Si) on a SiC substrate to form a first semiconductor layer; heat treatment under a nitrogen atmosphere to form a second semiconductor layer formed of SiCN between the substrate and the first semiconductor layer, forming a silicon compound, such as $SiO_2$, $Si_xN_{1-x}$ and SiON to form a third semiconductor layer, and forming a fourth semiconductor layer between the third semiconductor layer and the first semiconductor layer through heat treatment under nitrogen atmosphere.

FR 2 88 399 A1 discloses a method of forming a silicon nitride layer on SiC comprising the following steps: forming a Si layer on a SiC substrate, exposing the SiC substrate and the Si layer to NO molecules in a vacuum chamber, and annealing the structure at temperatures between 800-1000° C.

Power semiconductor devices are used as switches controlling the current flow through various electronic systems. Many of these known power semiconductor devices make use of a metal-insulator-semiconductor (MIS) structure. Devices that comprise a MIS structure are, for example, a power MIS field-effect transistor (MISFET—Metal Insulator Semiconductor Field Effect Transistor) designed to handle significant power levels or an insulated-gate bipolar transistor (IGBT). Power MISFETs are available in various different configurations, the most common configurations being the vertical power MISFET, the lateral power MISFET, the tri-gated MISFET and the gate-all-around MISFET.

While silicon (Si) is the most common and well understood semiconductor material for power semiconductor devices, silicon carbide (SiC) offers a number of attractive characteristics for high-voltage power semiconductors when compared to commonly used silicon (Si). Exemplarily the much higher breakdown field strength and a high thermal conductivity of SiC allow creating devices which outperform by far the corresponding Si devices, and enable reaching otherwise unattainable efficiency levels. SiC MISFETs offer superior dynamic performance over conventional Si power MISFETs. On the other side traps at the interface between SiC and the gate insulating layer as well as traps in the first few nanometers of the SiC material below the gate insulating layer dramatically affect the behavior of the SiC based MISFET devices. In particular the afore-mentioned traps modify the threshold voltage, reduce the steepness of the subthreshold slope, increase leakage in the off-state and reduce the amount of current in the on-state. Efforts in the prior art focus on avoiding such traps at or close to the interface between the gate insulation layer and the SiC material of a channel region below.

State of the art SiC power MOSFETs (Metal-Oxide-Semiconductor Field-Effect Transistor) compromise a gate dielectric which consist either in its entirety but at least partially of silicon dioxide ($SiO_2$). It appears to be the ubiquitous opinion of all relevant literature that especially the dielectric/SiC interface has to be formed by $SiO_2$ to assure reasonable carrier mobility and thus low drain-source on-state resistance $R_{DS}$ even if other dielectrics (high-k) are used. A gate insulating layer stack comprising a $SiO_2$ layer at the interface between the gate insulating layer-stack and the SiC substrate is disclosed, for example, in U.S. Pat. Nos. 6,246,076 B1, 7,507,629 B2 or 7,727,904 B2. Nevertheless, the mobility at an oxidized boundary layer to the SiC semiconductor is usually relatively low with values below 10 cm/Vs. Although there are several publications demonstrating a mobility in the range of 50 cm/Vs to 100 cm/Vs and some very few above, it is still a fraction of the theoretically achievable.

Often a post oxidation process is applied, in which Nitrogen, Phosphorus, Boron or other exceptional materials are brought to the oxide interface. U.S. Pat. No. 9,984,894 B2, for example, discloses to first grow an oxide layer on SiC, then perform nitridation of the oxide layer, and finally diffuse cesium ions into the oxide layer. In US 2012/0241767 A1 it is disclosed to reduce interface defects at the interface between a silicon dioxide gate insulating layer and SiC for improving channel mobility of a MOSFET device by doping or adding phosphorous into the gate insulating layer. These impurities, however, drastically reduce the lifespan of the gate dielectric and can further cause uncontrollable threshold voltage $V_{TH}$ shifts, mobile ions and reliability problems in all conceivable circumstances.

In the prior art document "4H—SiC MIS Capacitors and MISFETs With Deposited $SiN_x$/$SiO_2$ Stack-Gate Structures" by Masato Noborio et al., IEEE TRANSACTIONS ON ELECTRON DEVICES, vol. 55 no. 8, 8 Aug. 2008, it is disclosed a method for manufacturing a stack-gate MIS structure 1 as shown in FIG. 2. In this method, which is illustrated in FIG. 1, there is provided a 4H—SiC substrate 20 in a first step S10, a silicon nitride (SiN$_x$) layer is deposited on the substrate 20 by plasma enhanced chemical vapor deposition (PECVD) from silane (SiH$_4$) and ammonia (NH$_3$) in a second step S20, and a silicon dioxide (SiO$_2$) layer is then deposited on the SiNx layer by PECVD from SiH$_4$ and nitrogen oxide (N$_2$O) in a third step S30. A resulting layer stack is first annealed in an atmosphere of N$_2$O and 10% nitrogen (N$_2$) in a fourth step S40 and finally annealed in N$_2$ atmosphere in a fifth step S50.

The resulting stack-gate MIS structure 1 comprises the substrate 20 and an insulating layer 10 on the substrate 20. The insulating layer 10 comprises in an order starting from the substrate a SiN$_x$ layer 12, a SiO$_x$N$_y$ layer 13 and a SiO$_2$ layer 14 as shown in FIG. 2. Finally a gate electrode layer 15 is formed on the insulating layer 10 in a sixth step S60. The concentration of carbon in the insulating layer 10 as a function of the distance from an interface 25 between insulating layer 10 and substrate 20 was analyzed by Secondary Ion Mass Spectroscopy (SIMS) and the results are illustrated in FIG. 3. It can be seen from FIG. 3 that the carbon concentration in the whole insulating layer 10 is relatively high. Obviously, the carbon is coming from the 4H—SiC substrate 20. In such structure the carrier mobility in a region close to the interface 25 between the substrate 20 and the insulating layer 10 is significantly below the carrier mobility usually measured in 4H—SiC bulk material.

SUMMARY

Embodiments of the invention provide an insulated gate structure, a wide bandgap material power device with an insulated gate structure and a method for manufacturing an insulated gate structure, which can overcome the above-mentioned detrimental effects of traps at an interface between the wide bandgap material, e.g., silicon carbide (SiC), and a gate insulating layer as well as in the first few nanometers of the wide bandgap material, e.g., silicon carbide (SiC), below the gate insulating layer.

In an exemplary embodiment, an insulated gate structure comprises a wide bandgap material layer comprising a channel region of a first conductivity type; a gate insulating layer arranged directly on the channel region, the gate insulating layer comprising a first nitride layer, which is arranged directly on the channel region; and an electrically conductive gate electrode layer on the gate insulating layer, so that the gate electrode layer is separated from the wide bandgap material layer by the gate insulating layer. A concentration of carbon atoms in the gate insulating layer is less than $10^{18}$ atoms/cm$^{-3}$ at a distance of 3 nm from an interface between the wide bandgap material layer and the first nitride layer. The first nitride layer comprises a stoichiometric silicon nitride layer or an aluminum nitride layer or a boron nitride layer or a phosphorous nitride layer. These nitride layers are especially effective in protecting the channel region against carbon loss.

The wide bandgap material may be exemplarily silicon carbide (SiC), Gallium oxide (GaO), Gallium nitride (GaN) or diamond.

The relative low concentration of carbon atoms in a region near the interface means that exemplarily the silicon carbide layer has no deficit of carbon resulting in a relative high mobility of carriers in this region. The inventors found out that in prior art silicon carbide power devices with an MIS (Metal-Insulator-Semiconductor) or MOS (Metal-Oxide-Semiconductor) structure, the deficit of carbon in a channel region of a silicon carbide layer close to an interface between the silicon carbide layer and a gate insulating layer stack is the reason for a reduced carrier mobility in this region and that also the carbon atoms inside the oxide of the gate insulating layer stack reduce the mobility due to coulombic scattering of charges trapped in the oxide and the channel.

In an exemplary embodiment, the thickness of the first nitride layer is less than 20 nm or less than 10 nm or less than 5 nm. Only a relatively thin first nitride layer is sufficient to protect the underlying silicon carbide layer against loss of carbon into the insulating layer during deposition of subsequent layers of a gate insulating layer stack.

In an exemplary embodiment, the gate insulating layer comprises an intermediate insulating layer on the first nitride layer, wherein the intermediate insulating layer is made of a material different from that of the first nitride layer. In such exemplary embodiment a high carrier mobility in the channel region can be attained independently from the dielectric material of the intermediate insulating layer for optimizing the dielectric properties of the gate insulating layer.

In an exemplary embodiment, a second nitride layer is arranged on the intermediate insulating layer so that the intermediate insulating layer is sandwiched between the first nitride layer and the second nitride layer. The second nitride layer acts as a capping layer that can protect the underlying intermediate insulating layer against damage and impurities. The second nitride layer thereby ensures a higher and more stable quality of the intermediate insulating layer.

In an exemplary embodiment, the intermediate insulating layer comprises a high-k dielectric layer or a silicon oxide layer.

In an exemplary embodiment, the wide bandgap material layer comprises a source region and a drain region adjacent to the channel region, so that the channel region is sandwiched between the source region and the drain region, wherein the source region and the drain region have a second conductivity type different from the first conductivity type.

A method for manufacturing the insulated gate structure comprises the following steps: (a) providing a silicon carbide layer comprising a channel region; (b) forming a gate insulating layer on the channel region at least by the following two steps: deposition of a preliminary layer directly on the channel region of the silicon carbide layer, and nitridation of the preliminary layer in a nitrogen containing atmosphere to form a first nitride layer comprised in the gate insulating layer, wherein the preliminary layer comprises any one of silicon, aluminum, boron and phosphorous or any combination thereof; and (c) forming a gate electrode layer on the gate insulating layer.

In this exemplary embodiment the first nitride layer is formed without affecting the carbon content in the channel region. That means that no carbon loss takes place in the channel region during the steps of forming the first nitride layer to avoid formation of defects at the interface between the silicon carbide layer and the first nitride layer and in the channel region adjacent to that interface, to thereby maintain a high electron mobility in the channel region.

In an exemplary embodiment, the temperature during the nitridation in step (b) is in a range between 800° C. and 1400° C., or in a range between 900° C. and 1350° C. Such temperature ranges are optimal for efficient nitridation while avoiding carbon loss in the channel region.

In an exemplary embodiment, the preliminary layer is an amorphous silicon layer. Nitridation of amorphous silicon layer can be performed most efficient while the resulting silicon nitride layer has good properties of protecting the channel region against carbon losses.

In an exemplary embodiment, the preliminary layer has a thickness of less than 15 nm or less than 7.5 nm or less than 3.75 nm. With such thickness of the preliminary embodiment a most efficient nitridation of the preliminary layer is possible while the resulting first nitride layer can protect the channel region against carbon loss in subsequent method steps.

In an exemplary embodiment, step (b) further comprises a step of forming a second nitride layer or a silicon oxide layer on the preliminary layer before the step of nitridation. Surprisingly, nitridation is efficient also through the second nitride layer or the silicon oxide layer while the preliminary layer protects the channel region against carbon loss during the step of forming the second nitride layer or the silicon oxide layer. Exemplarily, the second silicon nitride layer is formed by chemical vapor deposition (CVD) such as by plasma enhanced CVD (PECVD).

In an exemplary embodiment, step (b) further comprises a step of forming an intermediate insulating layer on the first nitride layer. A high carrier mobility in the channel region can be attained in this exemplary embodiment independently from the dielectric material of the intermediate insulating layer for optimizing the dielectric properties of the gate insulating layer. Also, in such exemplary embodiment, step (b) may further comprise a step of forming a second nitride layer on the intermediate insulating layer so that the intermediate insulating layer is sandwiched between the first nitride layer and the second nitride layer. The second nitride layer acts as a capping layer that can protect the underlying intermediate insulating layer against damage and impurities. The second nitride layer thereby ensures a higher and more stable quality of the intermediate insulating layer. Exemplarily the intermediate insulating layer is a silicon oxide layer or a high-k dielectric layer.

BRIEF DESCRIPTION OF THE DRAWINGS

Detailed embodiments of the invention will be explained below with reference to the accompanying figures, in which.

The reference signs used in the figures and their meanings are summarized in the list of references signs. Generally, similar elements have the same reference signs throughout the specification. The described embodiments are meant as examples and shall not limit the scope of the invention.

DETAILED DESCRIPTION OF ILLUSTRATIVE EMBODIMENTS

Figure 4A:
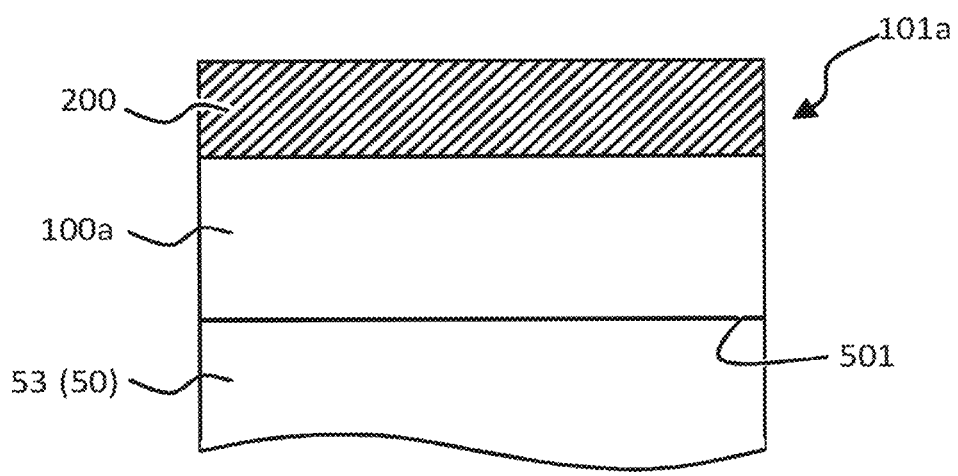
FIG. 4A shows a cross-section of an insulated gate structure according to a first embodiment.

In the following an insulated gate structure 101a according to a first embodiment is described with reference to FIG. 4A. The insulated gate structure 101a comprises a wide bandgap material layer 50 comprising a channel region 53, a gate insulating layer 100a on the wide bandgap material layer 50 and an electrically conductive gate electrode layer 200 on the gate insulating layer 100a. The wide bandgap material may be exemplarily silicon carbide (SiC), Gallium oxide (GaO), Gallium nitride (GaN) or diamond. In the following description of the examples of embodiments, the wide bandgap material is SiC. However, the invention is not limited to this specific wide bandgap material. The silicon carbide layer 50 may have any known polytype such as a cubic polytype 3C—SiC or any hexagonal polytype such 2H—SiC, 4H—SiC, or 6H—SiC. The gate insulating layer 100a comprises at least a first nitride layer 102 and is arranged directly on the channel region 53. The first nitride layer 102 comprises a silicon nitride layer, such as stoichiometric $Si_3N_4$, or an aluminum nitride layer (AlN) or a boron nitride (BN) layer or a phosphorous nitride (PN) layer. The first nitride layer 102 may also comprise a combination of two or more of silicon, aluminum, phosphorous and boron. The gate electrode layer 200 is separated from the silicon carbide layer 50 by the gate insulating layer 100a and may comprise any electrically conductive material such as doped poly-silicon or a metal material. A concentration of carbon atoms in the gate insulating layer bow is less than $10^{18}$ atoms/$cm^{-3}$ at a distance of 3 nm from an interface 501 between the silicon carbide layer 50 and the first nitride layer 102. Compared to the known insulated gate structures with a gate insulating layer on silicon carbide, the gate insulating layer 100a has a relatively low carbon concentration close to the interface 501 between the silicon carbide layer 50 and the gate insulating layer bow, which results in a high carrier mobility in the channel region 53.

Figure 4B:
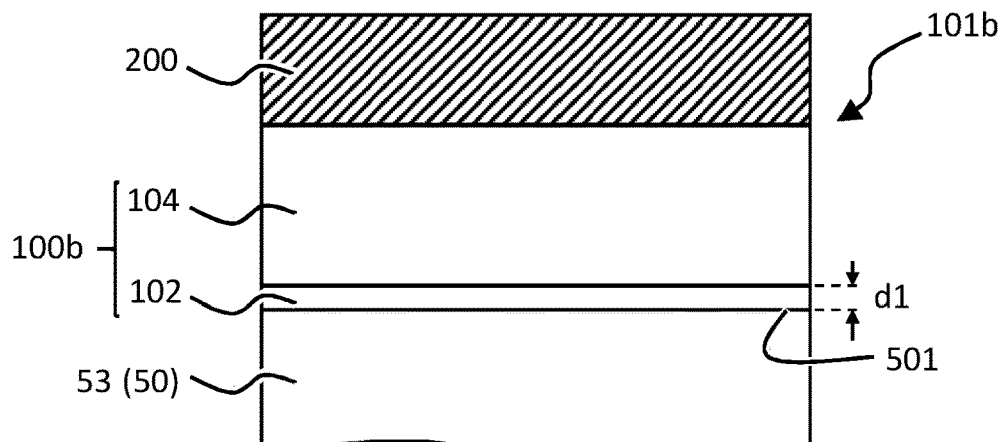
FIG. 4B shows a cross-section of an insulated gate structure according to a second embodiment.

In FIG. 4B there is shown an insulated gate structure 101b according to a second embodiment. In the following mainly differences to the first embodiment are described, whereas it is referred to the description of the first embodiment with regard to all other features. The insulated gate structure 101b differs from the insulated gate structure 101a according to the first embodiment in that that the gate insulating layer 100b has a two-layered structure comprising the first nitride layer 102 directly on the channel region 53 of the silicon carbide layer 50 and an intermediate insulating layer 104 on the first nitride layer 102. The intermediate insulating layer 104 may comprise any insulating material different from that of the first nitride layer 102. Exemplarily, the intermediate insulating layer comprises an oxide such as silicon dioxide ($SiO_2$) or a high-k dielectric material, such as aluminum oxide ($Al_2O_3$), hafnium oxide ($HfO_2$), or titanium oxide (TiO$_2$). Throughout the specification a high-k-dielectric material is defined as any dielectric material that has a dielectric constant higher than that of Si$_3$N$_4$, which is about 7.2.

A thickness d1 of the first nitride layer 102 is exemplarily less than 20 nm or less than 10 nm, or less than 5 nm. Exemplarily, the thickness d1 of the first nitride layer 102 is at least 3 nm.

As in the first embodiment, a concentration of carbon atoms in the gate insulating layer 100b is less than $10^{18}$ atoms/cm$^{-3}$ or less than $5\times10^{16}$ atoms/cm$^{-3}$ or less than $10^{15}$ atoms/cm$^{-3}$ at a distance of 3 nm from an interface 501 between the silicon carbide layer 50 and the first nitride layer 102. Compared to the known insulated gate structures with a gate insulating layer on silicon carbide, the gate insulating layer 100b has a relatively low carbon concentration close to the interface 501 between the silicon carbide layer 50 and the gate insulating layer 100a, which results, as in the first embodiment, in a high carrier mobility in the channel region 53.

Figure 4C:
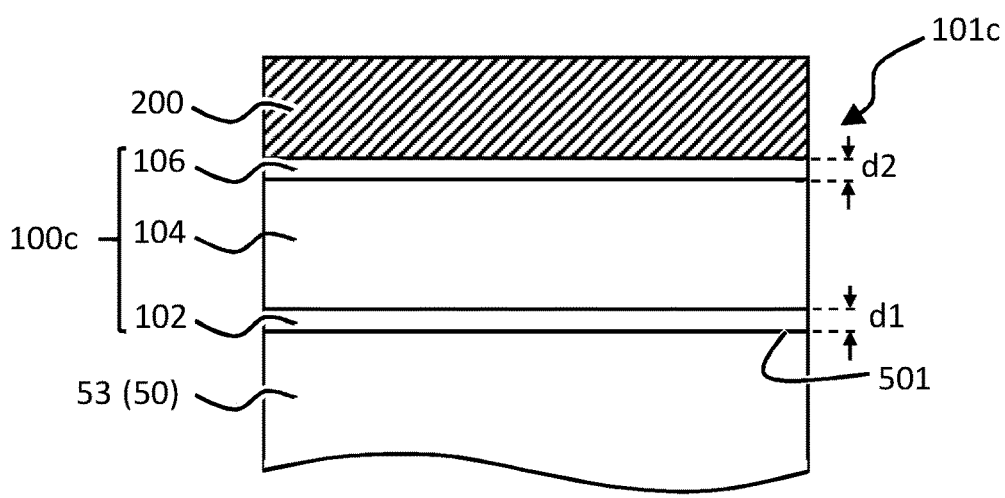
FIG. 4C shows a cross-section of an insulated gate structure according to a third embodiment.

In FIG. 4C there is shown an insulated gate structure 101c according to a third embodiment. In the following mainly differences to the second embodiment are described, whereas it is referred to the description of the second embodiment with regard to all other features. The insulated gate structure 101c differs from the before described insulated gate structure 101b according to the second embodiment in that it comprises in addition to the first nitride layer 102 a second nitride layer 106 on the intermediate insulating layer 104, so that the intermediate insulating layer 104 is sandwiched between the first nitride layer 102 and the second nitride layer 106. The gate electrode layer 200 is separated from the intermediate insulating layer 104 by the second nitride layer 106. A thickness d2 of the second nitride layer 106 is exemplarily at least 3 nm. The second nitride layer 106 can efficiently block any impurities from the gate electrode layer 200. Exemplarily, when the gate electrode layer 200 comprises highly doped poly silicon, the second nitride layer 106 efficiently blocks diffusion of dopant from the highly doped poly-silicon of gate electrode layer 200 into the intermediate insulating layer 104. In such manner, the second nitride layer increases the life time of the device by preventing degradation of the gate insulation layer 100c due to impurities diffused into the intermediate insulating layer 104, while the material of the intermediate insulating layer 104 can be freely chosen to have desired dielectric properties of the gate insulating layer 100c. As in the second embodiment the intermediate insulating layer 104 may comprise silicon dioxide or a high-k dielectric material, for example.

Figure 5A:
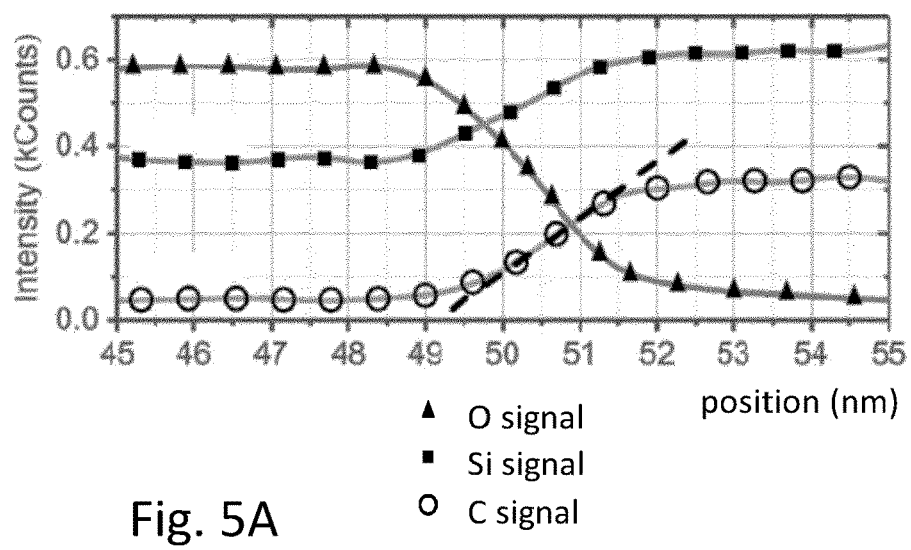
FIG. 5A illustrates SIMS measurement results for a sample of the insulated gate structure according to an exemplary embodiment.

FIG. 5A shows SIMS measurement results illustrating the concentration of silicon (Si) atoms, oxygen (O) atoms and carbon (C) atoms in a region adjacent to the interface 501 between the channel region 53 and the gate insulating layer 100b for a specific sample according to the second embodiment. In this specific example the first nitride layer 102 is a Si$_3$N$_4$ layer having a thickness d1 of 5 nm and the intermediate insulating layer 104 is a SiO$_2$ layer. The graph in FIG. 5A shows an intensity value (in arbitrary units) indicative of the concentration of oxygen, silicon and carbon in the sample depending on the position (nm). A position of 52 nm in the graph of FIG. 5A corresponds to the interface between the silicon carbide layer 50 and the first nitride layer 102 of the gate insulating layer 100b. That means, positions above 52 nm correspond to positions within the silicon carbide layer 50 and positions below 52 nm correspond to positions within the gate insulating layer 100b. The drop of the carbon concentration signal (C signal) from a relatively high value in the silicon carbide layer 50 to a relatively low value in the intermediate insulating layer 104 takes place within about 3 nm.

Figure 5B:
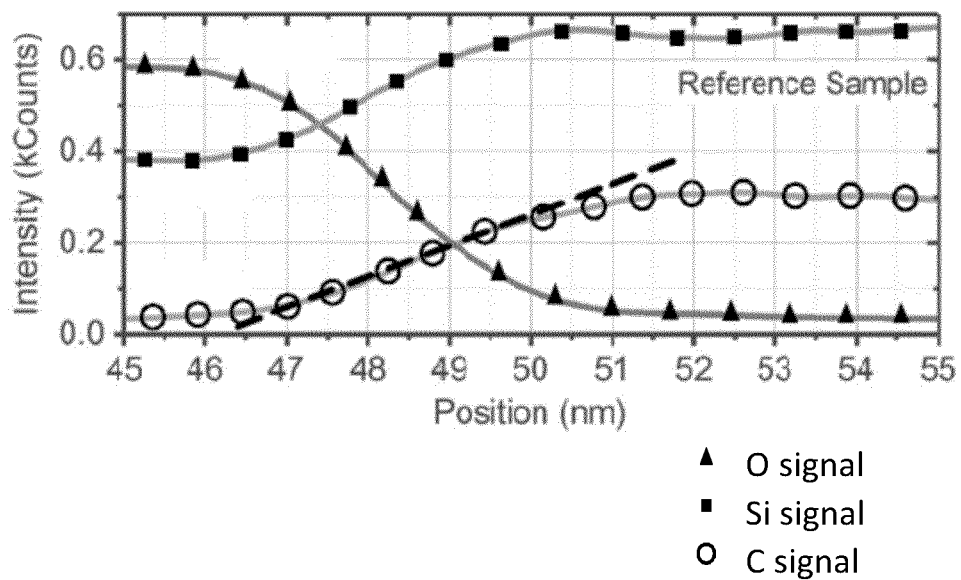
FIG. 5B illustrates SIMS measurement results for a reference sample.

As a comparison, FIG. 5B shows SIMS measurement results for a comparative reference sample without the first nitride layer 102, i.e. a SiO$_2$ layer is formed directly on a SiC layer in the reference sample. In FIG. 5B a position of 51.5 nm corresponds to the position of an interface between the SiC layer and the SiO$_2$ layer. Positions below 51.5 nm are positions within the SiO$_2$ layer and positions above 51.5 nm are positions within the SiC layer. As can be seen clearly in FIG. 5B, in the graph for the reference sample, the carbon concentration drops significantly slower from a relatively high value in the SiC layer to a relatively low value in the SiO$_2$ layer.

Figure 6:
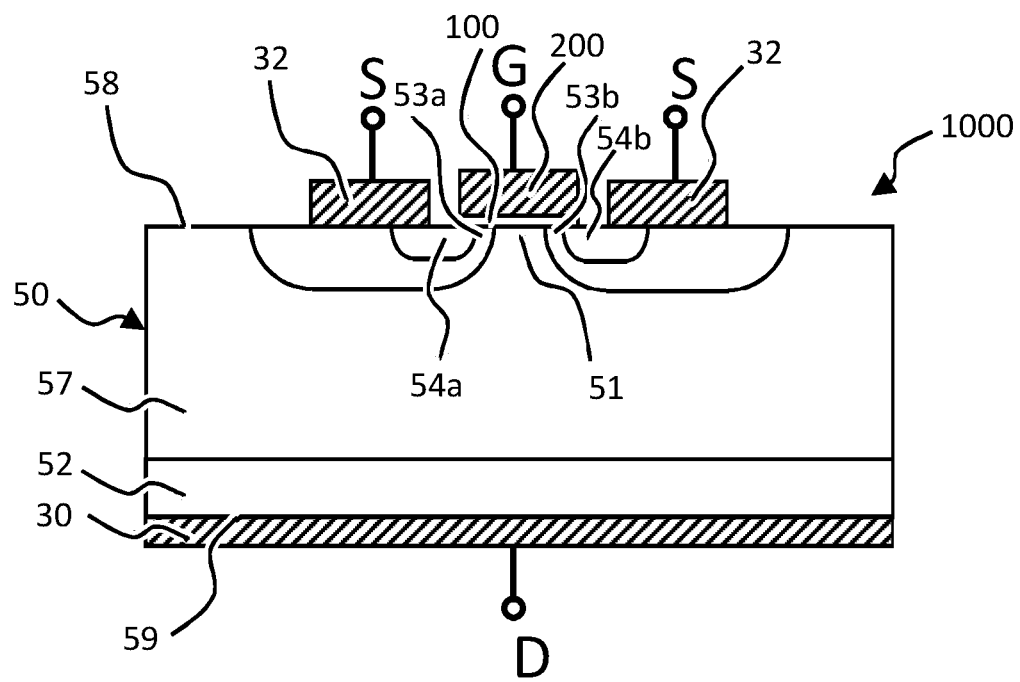
FIG. 6 shows a cross-section of a silicon carbide power device comprising an insulated gate structure according to an exemplary embodiment.

FIG. 6 shows a silicon carbide power device according to an exemplary embodiment in cross-section. The silicon carbide power device according to the exemplary embodiment is a silicon carbide based vertical power MISFET 1000, comprising a silicon carbide (SiC) layer 50 having a first main side 58 and a second main side 59 opposite to the first main side 58. The silicon carbide layer 50 comprises adjacent to the first main side 58 an n-type source region 54 comprising an n-type first source region 54a and an n-type second source region 54b, a p-type channel region 53 comprising a p-type first channel region 53a and a p-type second channel region 53b and an n-type drain region 51. The p-type first channel region 53a is laterally sandwiched between the n-type first source region 54a and the n-type drain region 51, and the p-type second channel region 53b is laterally sandwiched between the n-type drain region 51 and the n-type second source region 54b.

At the second main side 59 of the SiC layer 50 there is arranged a highly doped n-type drain layer 52, on which is arranged a drain electrode layer 30 on the second main side 59. On a side of the drain layer 52 opposite to the drain electrode layer 30 is arranged an n-type drift layer 57. The first source region 54a and the second source region 54b are in electrical contact to a source electrode layer 32 arranged on the first main side 58. On the first main side 58 there is further arranged a gate insulating layer 100 directly on the first channel region 53a and on the second channel region 53b.

A gate electrode layer 200 is formed on the gate insulating layer 100 to be separated from the first channel region 53a and from the second channel region 53b by the gate insulating layer 100. The first channel region 53a, the gate insulating layer 100 and the gate electrode layer 200 form an insulated gate structure in form of a first insulated gate structure, and the second channel region 53b, the gate insulating layer 100 and the gate electrode layer 200 form an insulated gate structure in form of a second insulated gate structure in the vertical power MISFET 1000. The first and the second insulated gate structures are respectively structured in accordance with any one of the first, second or third embodiment. Therefore, for details regarding the structure of the first and second insulated gate structure it is referred to the discussion of the insulated gate structure according to the first to third embodiment as described above.

In the following a method for manufacturing the insulated gate structure 101a according to the first embodiment is described with reference to FIG. 7. The method comprises a first step S100 of providing a silicon carbide layer 50 comprising a channel region 53 of a first conductivity type. The silicon carbide layer 50 may have any one of the existing polytypes such as the cubic polytype 3C—SiC or any one of the hexagonal polytypes 2H—SiC, 4H—SiC, or 6H—SiC, for example.

In a second step S200, a preliminary layer is formed directly on the channel region 53. The preliminary layer comprises a silicon layer or an aluminum layer or a boron nitride layer or a phosphorous layer. Exemplarily, the preliminary layer may be an amorphous silicon layer deposited on the silicon carbide layer 50. A thickness of the preliminary layer is exemplarily less than 15 nm or less than 7.5 nm or less than 3.75 nm, and is exemplarily at least 2 nm.

In a third step S300 a nitridation of the preliminary layer is performed to form a first nitride layer. In case that the preliminary layer is a silicon layer, the first nitride layer is a silicon nitride layer such as stoichiometric $Si_3N_4$, in case that the preliminary layer is an aluminum layer the first nitride layer is an aluminum nitride (AlN) layer, in case that the preliminary layer is a boron layer, the first nitride layer is a boron nitride (BN) layer, and in case that the preliminary layer is a phosphorous layer, the first nitride layer is a phosphorous nitride (PN) layer. The resulting thickness of the first nitride layer is exemplarily less than 20 nm, less than 10 nm or less than 5 nm. Nitridation in the third step S300 is exemplarily performed in a nitrogen containing atmosphere such as in $N_2$ at a temperature in a range between 800° C. and 1400° C., or in a range between 900° C. and 1350° C. Alternatively, nitridation may be performed in a plasma assisted process in a nitrogen containing atmosphere at a temperature between 200° C. and 500° C. Such plasma assisted process may be followed by an annealing in nitrogen containing atmosphere at a higher temperature in a range between 800° C. and 1400° C., or in a range between 900° C. and 1350° C.

The two-step process of forming the first nitride layer 102, which comprises the second step S200 of forming the preliminary layer and of the subsequent third step S300 of nitridation ensures that no reaction with the silicon carbide layer 50 takes place and no or only very little carbon from the silicon carbide layer 50 is incorporated into the gate insulating layer bow. As the inventors found out, such process in which no or only little carbon from the silicon carbide layer 50 is incorporated in the gate insulating layer results in a relatively high carrier mobility in the channel region.

In a fourth step S400 a second nitride layer 106 is formed on the first nitride layer 102 by a deposition process such as chemical vapor deposition (CVD) or plasma enhanced CVD (PECVD). The second nitride layer 106 may comprise the same nitride material as the first nitride layer 102. In case that the second nitride layer 106 is a silicon nitride layer, it may be formed by PECVD from $SiH_4$ and $NH_3$, for example.

In a fifth step S500, the resulting layer stack including the first nitride layer 102 and second nitride layer 106 is annealed in nitrogen ($N_2$) to densify and heal defects in the first and second nitride layers.

Figure 1:
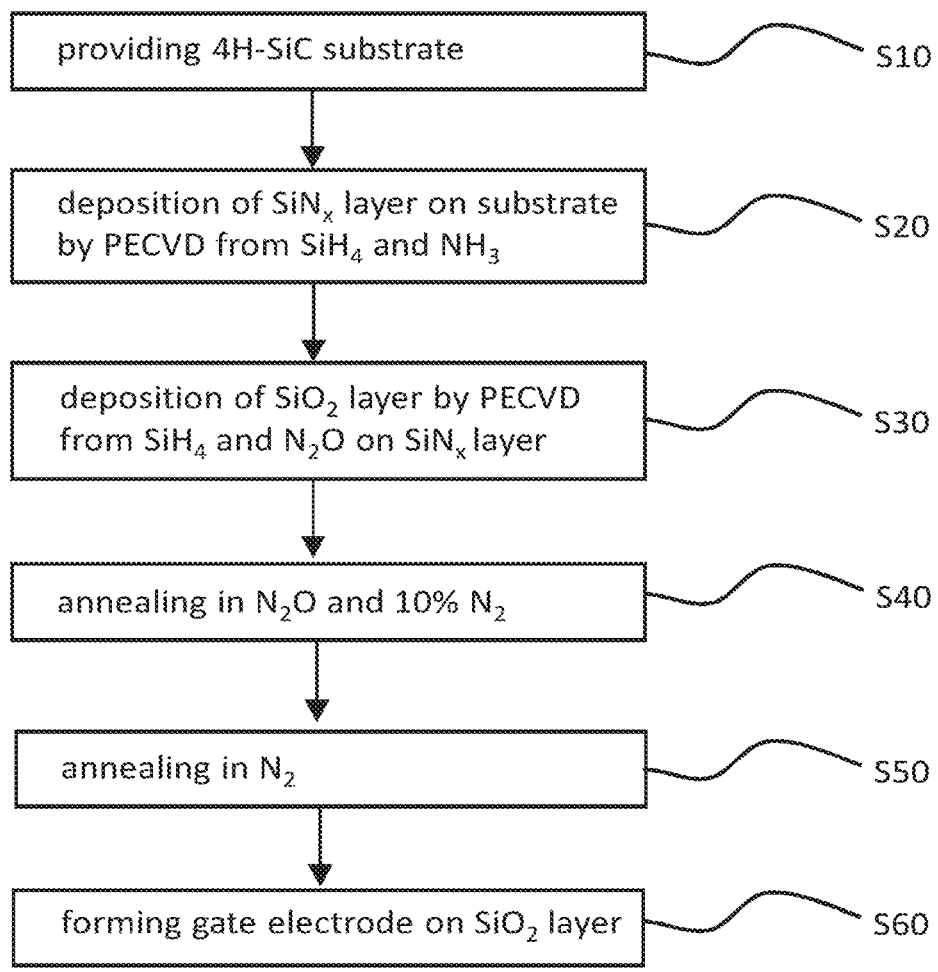
FIG. 1 shows a flow chart of a known method for manufacturing a stack-gate MIS structure.
Figure 2:
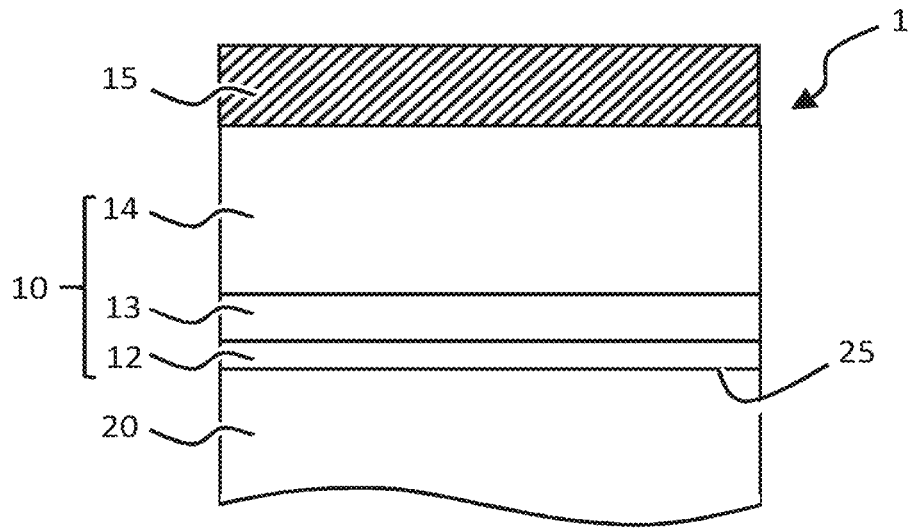
FIG. 2 illustrates the structure of the known stack-gate MIS structure.
Figure 3:
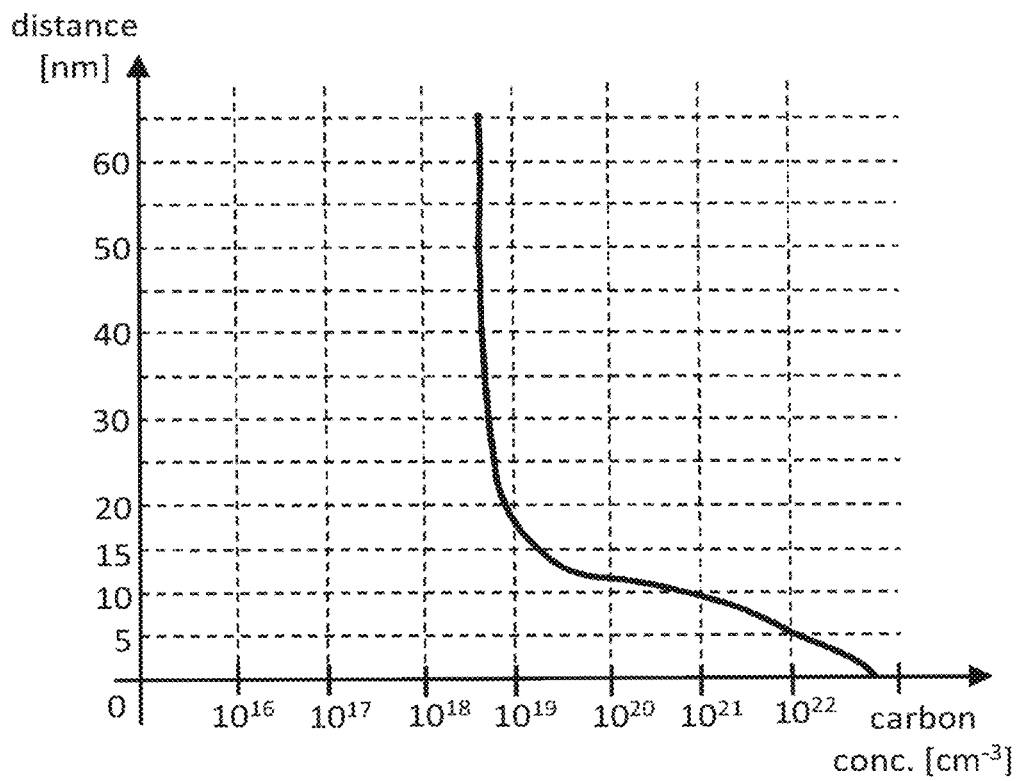
FIG. 3 shows SIMS measurement results for the structure shown in FIG. 2.

Finally, in a sixth step S700, a gate electrode layer 15 is formed on the second nitride layer 106 to obtain an insulated gate structure as shown in FIG. 1, for example. In case that the first nitride layer 102 and the second nitride layer 106 comprise the same nitride material then the resulting gate insulating layer bow comprises only one single continuous nitride layer, whereas if the first nitride layer 102 and the second nitride layer 106 comprise different nitride materials, the resulting gate insulating layer bow has a two-layered structure with two distinguishable nitride layers similar to the gate insulating layer mob shown in FIG. 4B.

The resulting insulated gate structure 101a exhibits a high carrier mobility in the channel region 50 as discussed above.

Figure 7:
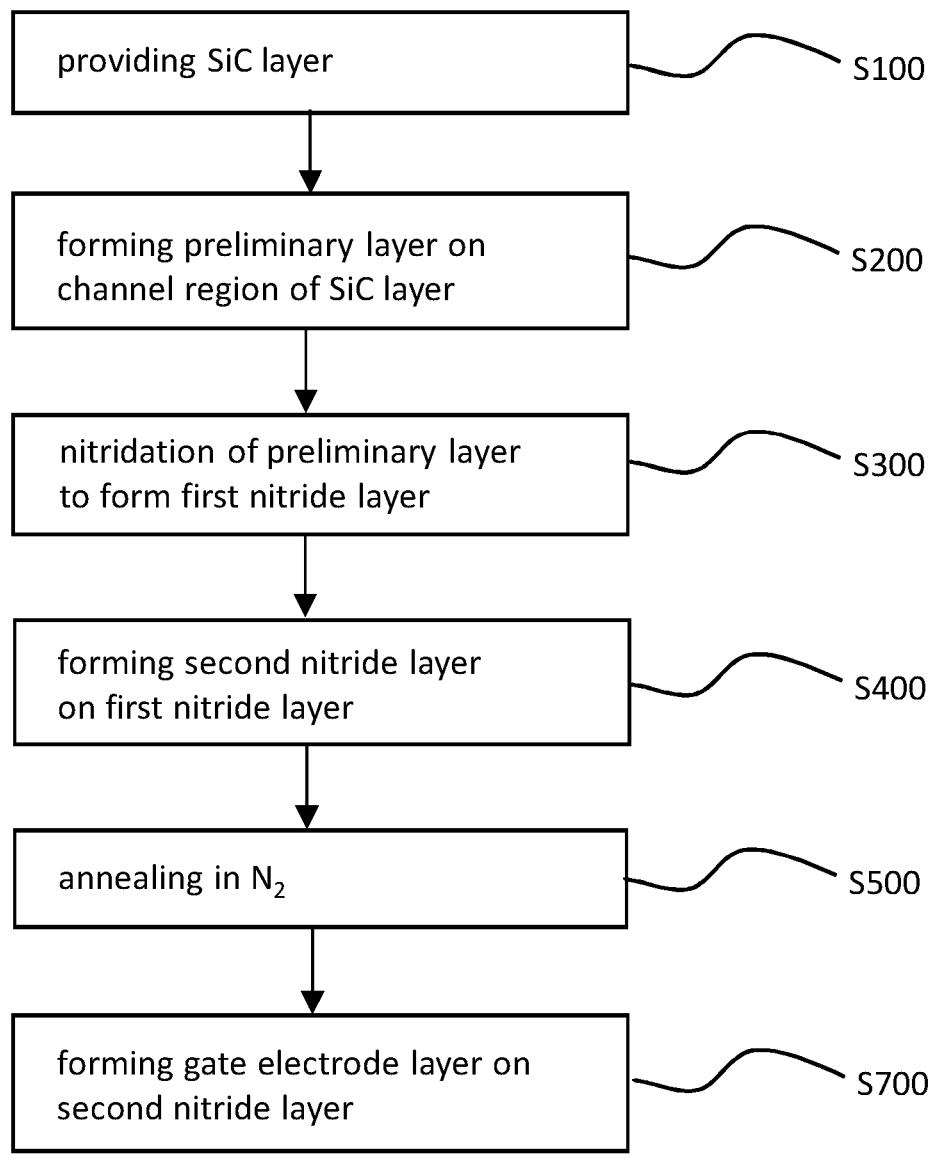
FIG. 7 shows a flow chart illustrating a method for manufacturing an insulated gate structure according to the first embodiment.
Figure 8:
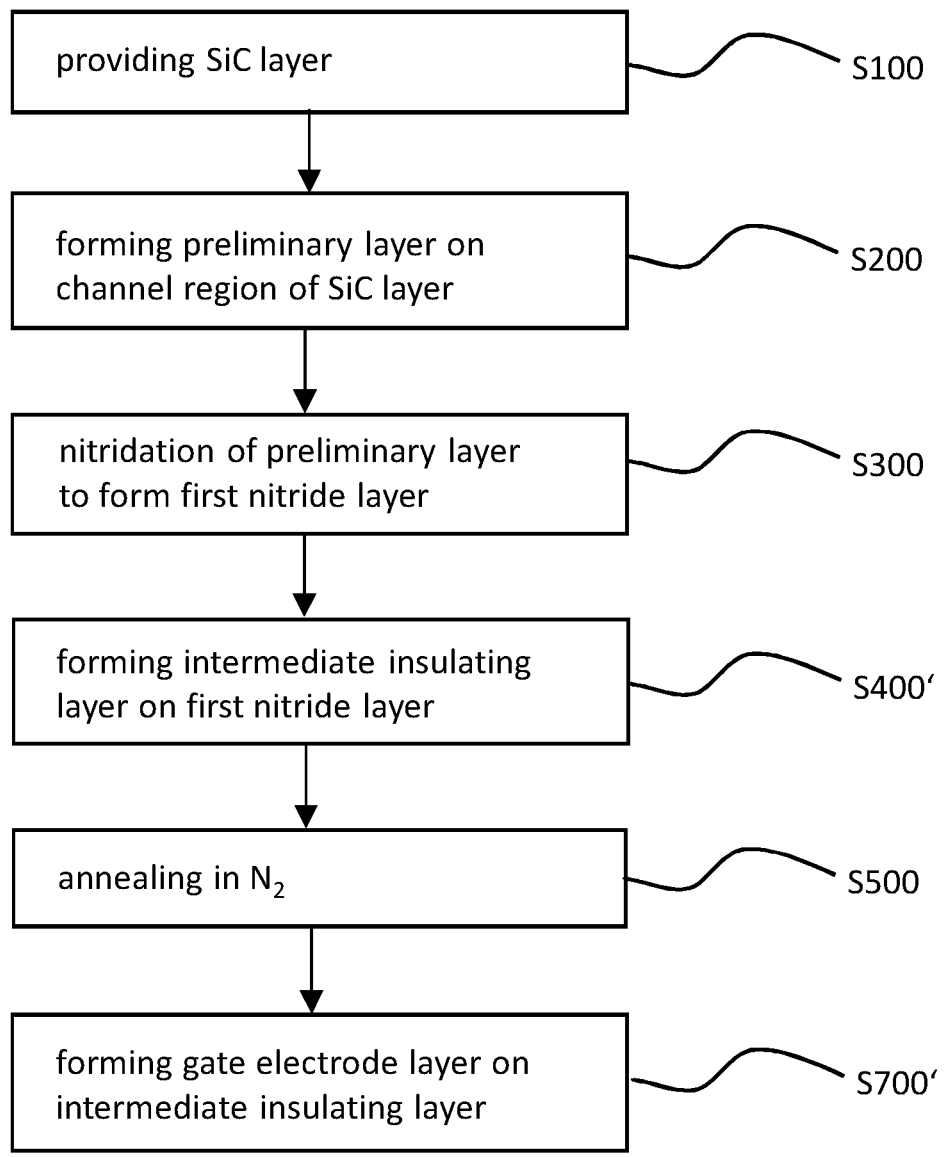
FIG. 8 shows a flow chart illustrating a method for manufacturing an insulated gate structure according to the second embodiment.

FIG. 8 shows a flow chart illustrating a method for manufacturing the insulated gate structure 101b according to the second embodiment. Due to many similarities with the method discussed before, only differences to the method discussed above with reference to FIG. 7 are explained. The method of FIG. 8 differs from the method of FIG. 7 in that no second nitride layer is formed on the first nitride layer 102, but instead an intermediate insulating layer 104 is formed on the first nitride layer 102 in a fourth method step 400', wherein the intermediate insulating layer 104 may comprise any insulating material different from the first nitride layer 102. Exemplarily, the intermediate insulating layer 104 may comprise a $SiO_2$ layer or a high-k dielectric layer or a nitride layer of a nitride material different from that of the first nitride layer 102. A process for forming a $SiO_2$ layer or a high-k dielectric layer or a nitride layer (different from that of the first nitride layer 102) is known to the person skilled in the art.

Figure 9:
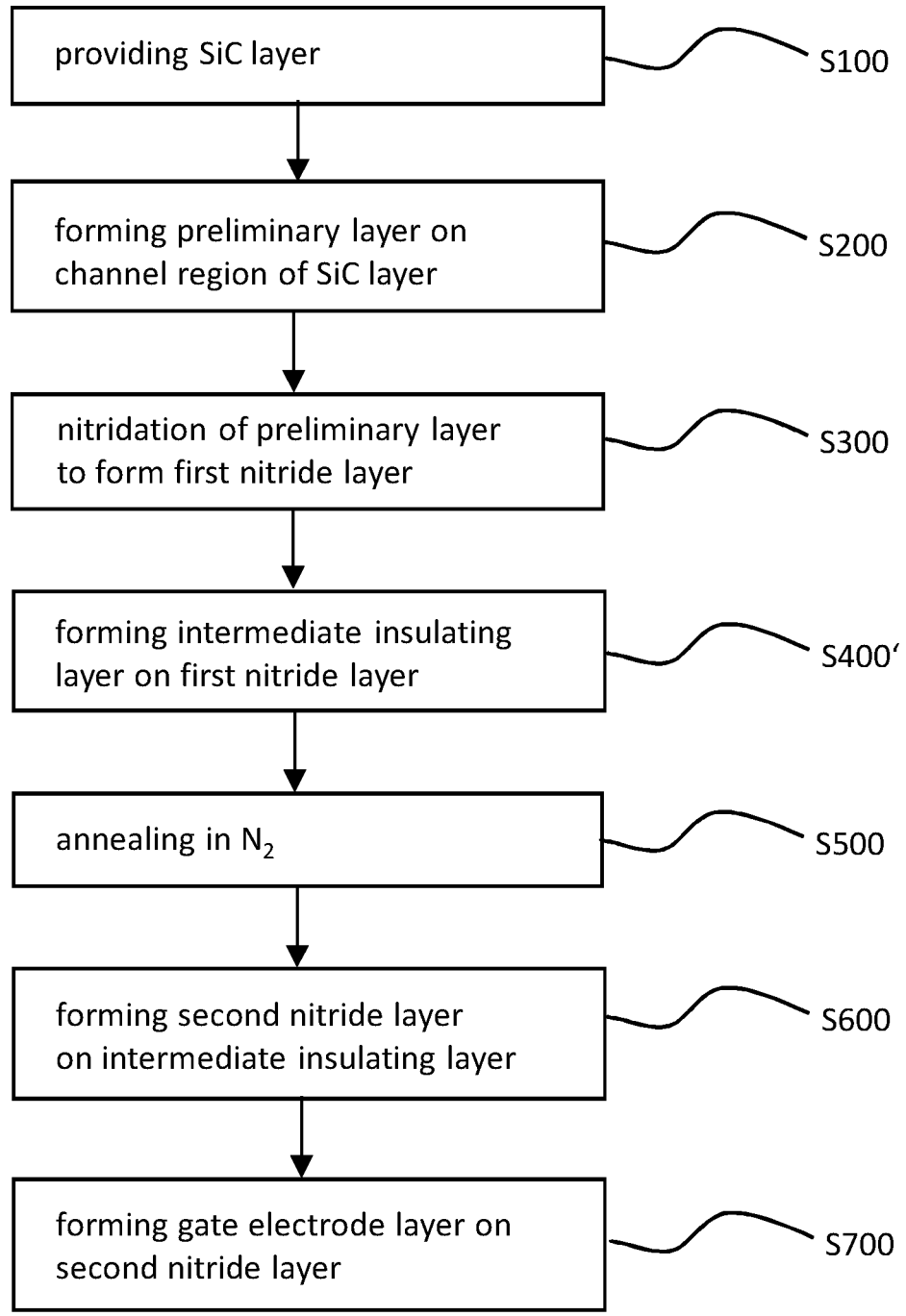
FIG. 9 shows a flow chart illustrating a method for manufacturing an insulated gate structure according to the third embodiment.

FIG. 9 shows a flow chart illustrating a method for manufacturing the insulated gate structure low according to the third embodiment. Due to many similarities with the method discussed before, only differences to the method discussed above with reference to FIG. 8 are explained. The method of FIG. 9 differs from the method of FIG. 8 in that it further comprises a step S600 performed after the step S500 of annealing in $N_2$ and before the step S700 of forming the gate electrode layer 200 on the gate insulating layer 100c. In step S600 a second nitride layer 106 is formed on the intermediate insulating layer 102. A process for forming the second nitride layer 106 is not limited to any specific process and may be formed by a process known to the skilled person, for example. A thickness d2 of the second nitride layer 106 may exemplarily be at least 3 nm. As discussed above with reference to FIG. 4C, the second nitride layer 106 prevents incorporation of impurities into and damage of the intermediate insulating layer 104 and the first nitride layer 102. Exemplarily, if the gate electrode layer 200 formed in step S700 is formed of highly doped polysilicon, the second nitride layer 106 may block incorporation of dopant from the gate electrode layer 200 into the intermediate insulating layer 104 and into the first nitride layer 102 of the gate insulating layer 100c.

Figure 10:
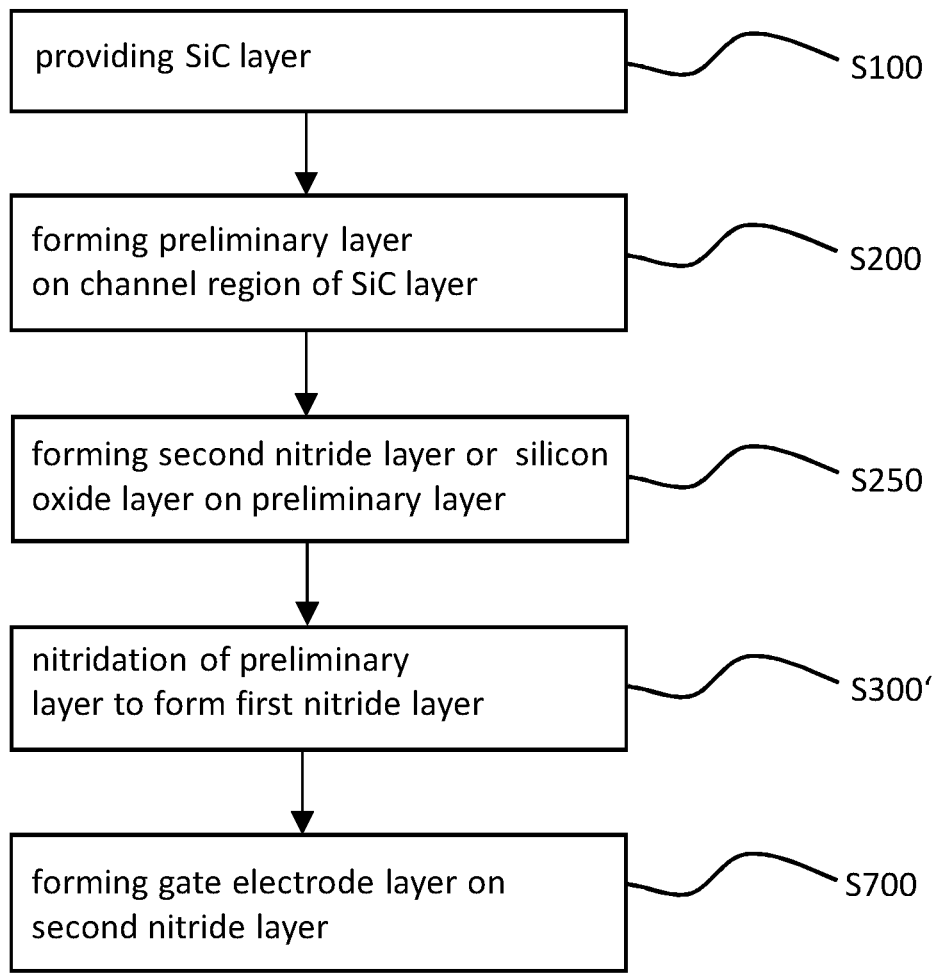
FIG. 10 shows a flow chart illustrating a modification of the method illustrated in FIG. 7.

FIG. 10 shows a flow chart illustrating a modification of the method illustrated in FIG. 7. Due to many similarities with the method discussed above with reference to FIG. 7, only differences thereto are explained in the following. The method of FIG. 10 differs from the method of FIG. 7 only in that a step S250 of forming the second nitride layer 106 is performed before a step S300' of nitridation of the preliminary layer. That means that the second nitride layer is formed on the preliminary layer and only after forming the second nitride layer on the preliminary layer, the nitridation of the preliminary layer is performed in step S300'. The inventors found out that nitridation of the preliminary layer is surprisingly possible through the second nitride layer on the preliminary layer. Such method may be most efficient in preventing any incorporation of carbon from the silicon carbide layer 50 into the gate insulating layer bow and a high carrier mobility in the channel region can be achieved. Alternatively a silicon oxide layer may be formed in step S250 on the first insulating layer before the step S300' of nitridation of the preliminary layer as indicated in FIG. 10 (see step S250).

Figure 11:
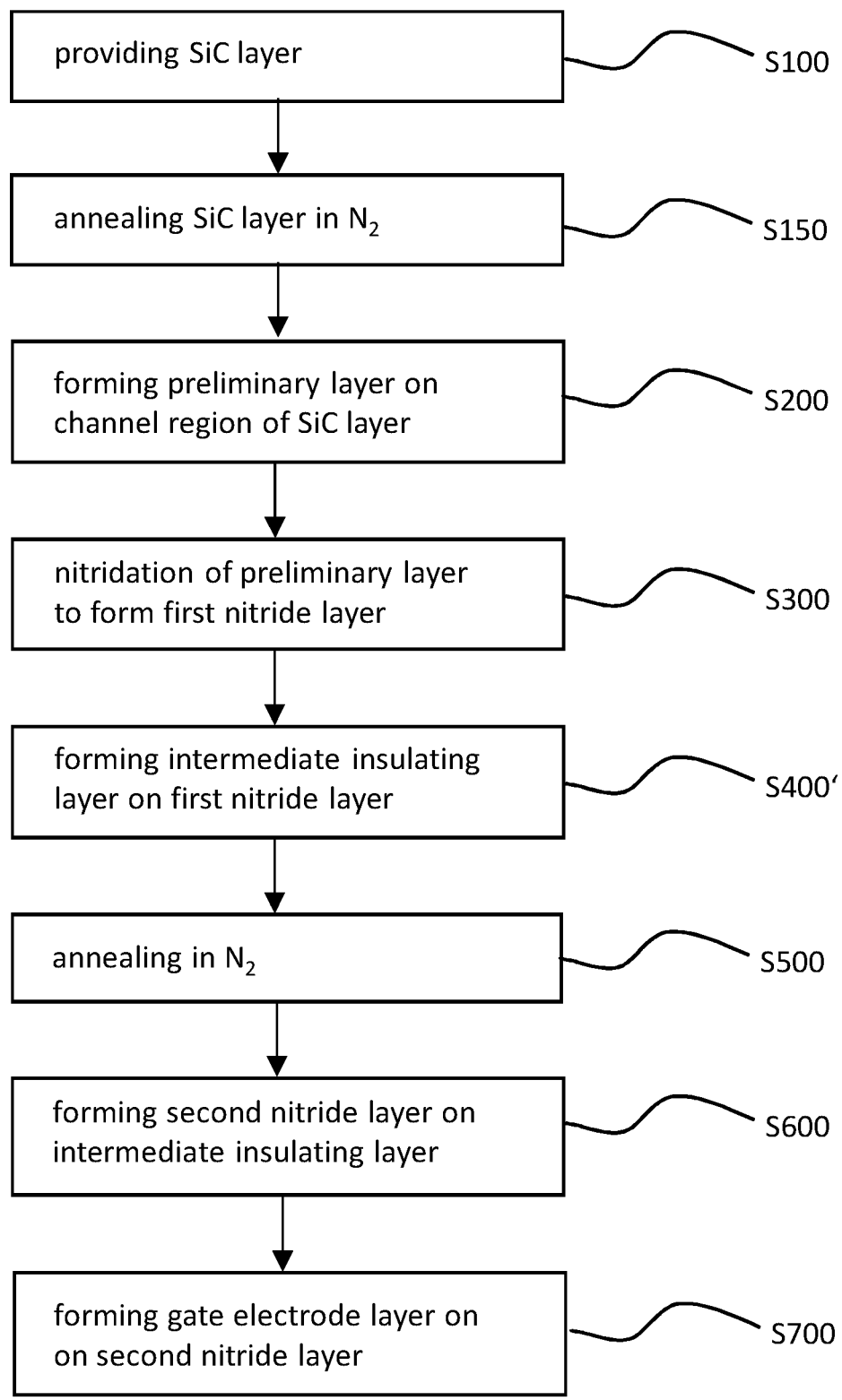
FIG. 11 shows a flow chart illustrating a modification of the method illustrated in FIG. 9.

FIG. 11 shows a flow chart illustrating a modification of the method illustrated in FIG. 9. Due to many similarities with the method discussed above with reference to FIG. 9, only differences thereto are explained in the following. The method of FIG. 11 differs from the method of FIG. 9 only in that it comprises an additional step 150 of annealing the silicon carbide layer 50 in $N_2$ before the step S200 of forming the preliminary layer on the silicon carbide layer 50.

In an exemplary embodiment a method for manufacturing a silicon carbide power device may comprise any one of the above exemplary embodiments of methods for forming an insulated gate structure. In case that the silicon carbide power device is a MISFET as shown in FIG. 6 or a silicon carbide power device comprising a MISFET, the silicon carbide layer 50 provided in step S100 may comprise a first conductivity type source region 54a, 54b and a first conductivity type drain region 51 adjacent to the second conductivity type channel region 53a, 53b, so that the channel region 53a, 53b is sandwiched between the source region 54a, 54b and the drain region 51, wherein the first conductivity type is different from the second conductivity type.

In the above embodiments the silicon carbide power device was described to be a vertical power MISFET. However, the concept of the invention may also be applied to any other SiC power device comprising an insulated gate structure, such as to a lateral power MISFET, a gate-all around MISFET, a tri-gated MISFET or an insulated gate bipolar thyristor (IGBT).

It will be apparent for persons skilled in the art that modifications of the above described embodiment are possible without departing from the scope of the invention as defined by the appended claims.

The additional method step S150 of annealing the silicon carbide layer 50 in $N_2$ before the step of forming the preliminary layer was discussed only as a modification of the method of FIG. 9. However, the additional step S150 may be performed also for any of the other described methods for manufacturing an insulated gate structure.

In all above embodiments the conductivity types may be switched, i.e. in any embodiment, all n-type regions may be p-type and all p-type regions may be n-type.

It should be noted that the term "comprising" does not exclude other elements or steps and that the indefinite article "a" or "an" does not exclude the plural. Also elements described in association with different embodiments may be combined.

LIST OF REFERENCE SIGNS 1 stack-gate MIS structure
10 insulating layer
12 $SiN_x$ layer
13 $SiO_xN_y$ layer
14 $SiO_2$ layer
15 gate electrode layer
20 substrate
25 interface
30 drain electrode
32 source electrode
50 wide bandgap material layer
51 drain region
52 buffer layer
53, 53a, 53b channel region
54a, 54b source region
57 drift layer
58 first main side
59 second main side
100, 100a, 100b, 100c gate insulating layer
101a, 101b, 101c insulated gate structure
102 first nitride layer
104 intermediate insulating layer
106 second nitride layer
200 gate electrode layer
501 interface
1000 vertical power MISFET
d1 thickness (of first nitride layer 102)
d2 thickness (of second nitride layer 104)

The invention claimed is:

1. An insulated gate structure comprising:
a wide bandgap material layer comprising a channel region of a first conductivity type;
a gate insulating layer arranged directly on the channel region, the gate insulating layer comprising a first nitride layer that is arranged directly on the channel region, wherein the gate insulating layer has a concentration of carbon atoms that is less than $10^{18}$ atoms/$cm^{-3}$ at a distance of 3 nm from an interface between the wide bandgap material layer and the first nitride layer and wherein the first nitride layer comprises a stoichiometric silicon nitride layer, an aluminum nitride layer, a boron nitride layer or a phosphorous nitride layer; and
an electrically conductive gate electrode layer over the gate insulating layer so that the gate electrode layer is separated from the wide bandgap material layer by the gate insulating layer.

2. The insulated gate structure according to claim 1, wherein the first nitride layer has a thickness that is less than 20 nm.

3. The insulated gate structure according to claim 1, wherein the first nitride layer has a thickness that is less than 5 nm.

4. The insulated gate structure according to claim 1, wherein the gate insulating layer further comprises an intermediate insulating layer on the first nitride layer, wherein the intermediate insulating layer is made of a material different from that of the first nitride layer.

5. The insulated gate structure according to claim 4, further comprising a second nitride layer is arranged directly on the intermediate insulating layer so that the intermediate insulating layer is sandwiched between the first nitride layer and the second nitride layer.

6. The insulated gate structure according to claim 4, wherein the wide bandgap material layer is a silicon carbide layer and the intermediate insulating layer comprises a high-k dielectric layer that has a dielectric constant higher than that of $Si_3N_4$.

7. The insulated gate structure according to claim 4, wherein the wide bandgap material layer is a silicon carbide layer and the intermediate insulating layer comprises a silicon oxide layer.

8. A wide bandgap material power device comprising:
a wide bandgap material layer comprising a channel region of a first conductivity type and a source region and a drain region of a second conductivity different than the first conductivity type, the source region spaced from the drain region by the channel region;
a gate insulating layer arranged directly on the channel region, the gate insulating layer comprising a first nitride layer that is arranged directly on the channel region, wherein the gate insulating layer has a concentration of carbon atoms that is less than $10^{18}$ atoms/$cm^{-3}$ at a distance of 3 nm from an interface between the wide bandgap material layer and the first nitride layer and wherein the first nitride layer comprises a stoichiometric silicon nitride layer, an aluminum nitride layer, a boron nitride layer or a phosphorous nitride layer; and an electrically conductive gate electrode layer over the gate insulating layer so that the gate electrode layer is separated from the wide bandgap material layer by the gate insulating layer.

9. The device according to claim 8, wherein:

the wide bandgap material layer is a silicon carbide layer;

the gate insulating layer further comprises an intermediate insulating layer on the first nitride layer and a second nitride layer arranged directly on the intermediate insulating layer; and the intermediate insulating layer comprises a high-k dielectric layer that has a dielectric constant higher than that of $Si_3N_4$.

10. A method for manufacturing an insulated gate structure, the method comprising:

forming a gate insulating layer arranged directly on a channel region of a wide bandgap material layer, the gate insulating layer comprising a first nitride layer that is arranged directly on the channel region, wherein the gate insulating layer has a concentration of carbon atoms that is less than $10^{18}$ atoms/cm$^{-3}$ at a distance of 3 nm from an interface between the wide bandgap material layer and the first nitride layer and wherein the first nitride layer comprises a stoichiometric silicon nitride layer, an aluminum nitride layer, a boron nitride layer or a phosphorous nitride layer; and forming an electrically conductive gate electrode layer over the gate insulating layer.

11. The method according to claim 10, wherein forming the gate insulating layer comprises:

depositing a preliminary layer directly on the channel region of the wide bandgap material layer, wherein the preliminary layer comprises silicon, aluminum, boron, or phosphorous or any combination thereof; and nitriding the preliminary layer in a nitrogen containing atmosphere to form the first nitride layer.

12. The method according to claim 11, wherein the nitriding is performed at a temperature in a range between 800° C. and 1400° C.

13. The method according to claim 11, wherein the preliminary layer comprises an amorphous silicon layer.

14. The method according to claim 11, wherein depositing the preliminary layer comprises depositing a layer having a thickness of less than 15 nm.

15. The method according to claim 14, wherein depositing the preliminary layer comprises depositing a layer having a thickness of less than 3.75 nm.

16. The method according to claim 11, wherein forming the gate insulating layer further comprises forming a second nitride layer on the preliminary layer before the nitriding.

17. The method according to claim 11, wherein forming the gate insulating layer further comprises forming a silicon oxide layer on the preliminary layer before the step of nitriding.

18. The method according to claim 11, wherein forming the gate insulating layer further comprises forming an intermediate insulating layer on the first nitride layer.

19. The method according to claim 18, wherein forming the gate insulating layer further comprises forming a second nitride layer on the intermediate insulating layer so that the intermediate insulating layer is sandwiched between the first nitride layer and the second nitride layer.

20. The method according to claim 18, wherein the intermediate insulating layer is a high-k dielectric layer having a dielectric constant higher than that of $Si_3N_4$.

* * * * *